(12) United States Patent
Huang

(10) Patent No.: US 6,617,633 B2
(45) Date of Patent: Sep. 9, 2003

(54) VERTICAL READ-ONLY MEMORY AND FABRICATION THEREOF

(75) Inventor: Shui-Chin Huang, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/047,665

(22) Filed: Jan. 15, 2002

(65) Prior Publication Data

US 2003/0122171 A1 Jul. 3, 2003

(30) Foreign Application Priority Data

Dec. 28, 2001 (TW) .................................. 90132743 A

(51) Int. Cl.[7] ........................................... H01L 27/108
(52) U.S. Cl. .................. 257/296; 257/297; 257/304; 257/390; 257/391; 257/392; 257/302; 438/289; 438/242
(58) Field of Search ................................ 257/390, 391, 257/296, 297, 304, 392, 302; 438/289, 242

(56) References Cited

U.S. PATENT DOCUMENTS

| 5,300,804 A | * | 4/1994 | Arai ........................... 257/332 |
| 5,618,742 A | * | 4/1997 | Shone et al. ................. 438/263 |
| 6,265,748 B1 | * | 7/2001 | Hofmann et al. ........... 257/390 |

* cited by examiner

Primary Examiner—Sara Crane
Assistant Examiner—Junghwa Im
(74) Attorney, Agent, or Firm—J.C. Patents

(57) ABSTRACT

A vertical read-only memory (ROM) is provided, which includes a gate on a substrate, a source/drain at the bottom of a trench in the substrate, a polysilicon bit-line in the trench, and a dielectric layer separating the polysilicon bit-line and the side-walls of the trench. The polysilicon bit-line electrically connects with the source/drain. The substrate of the side-wall of the trench adjacent to the gate serves as a coding region.

7 Claims, 7 Drawing Sheets

US 6,617,633 B2

VERTICAL READ-ONLY MEMORY AND FABRICATION THEREOF

CROSS-REFERENCE TO RELATED APPLICATION

This application claims the priority benefit of Taiwan application Ser. No. 90132743, filed Dec. 28, 2001.

BACKGROUND OF THE INVENTION

1. Field of Invention

The present invention relates to a semiconductor device and the fabrication thereof. More particularly, the present invention relates to a vertical read-only memory (ROM) and the fabrication thereof.

2. Description of Related Art

A conventional read-only memory stores 1-bit data in each memory cell and the size of the memory cell is restricted by the minimum linewidth of the lithography process. Therefore, it is not easy to scale down the conventional read-only memory. Besides, a conventional read-only memory is programmed by implanting a high concentration of ions with a conductivity type different from that of a source/drain into the channel regions of the selected memory cells, so as to raise the threshold voltage of the selected memory cells. However, the threshold voltage easily shifts to cause a leakage current because of a non-uniform dosage distribution of the ion implantation.

SUMMARY OF THE INVENTION

In view of the above-mentioned problems, the present invention provides a vertical read-only memory and a method for fabricating the same, by which a more uniform threshold voltage distribution can be obtained.

This invention also provides a vertical read-only memory and a method for fabricating the same, by which the leakage in a memory cell can be decreased.

The vertical read-only memory of this invention comprises a gate on a substrate, a source and a drain at the bottom of a trench in the substrate, a polysilicon bit-line in the trench, and a dielectric layer separating the polysilicon bit-line and the substrate of the side-wall of the trench. The polysilicon bit-line electrically connects with the source/drain. The substrate of the side-wall of the trench adjacent to the gate serves as a coding region.

Since there are two side-walls of the trench adjacent to the gate at the source side and at the drain side, respectively, the vertical read-only memory has two coding regions in one memory cell and thus can store two bits in one memory cell. Further, the two bits are stored in two coding regions perpendicular to the surface of the wafer, so that miniaturizing the memory device is not restricted by the minimum linewidth of the lithography process. Consequently, the memory device can be easily scaled down. In addition, the threshold voltage of the channel in the substrate of the side-wall of the trench is determined by the thickness of the dielectric layer, which can be well controlled by the conditions for forming the dielectric layer. Therefore, the threshold voltage ($V_T$) distribution of the memory device is more uniform, so that the leakage current can be decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically illustrates a vertical read-only memory provided in the first embodiment of this invention.

DESCRIPTION OF THE PREFERRED EMBODIMENTS

First Embodiment

Figure 1:
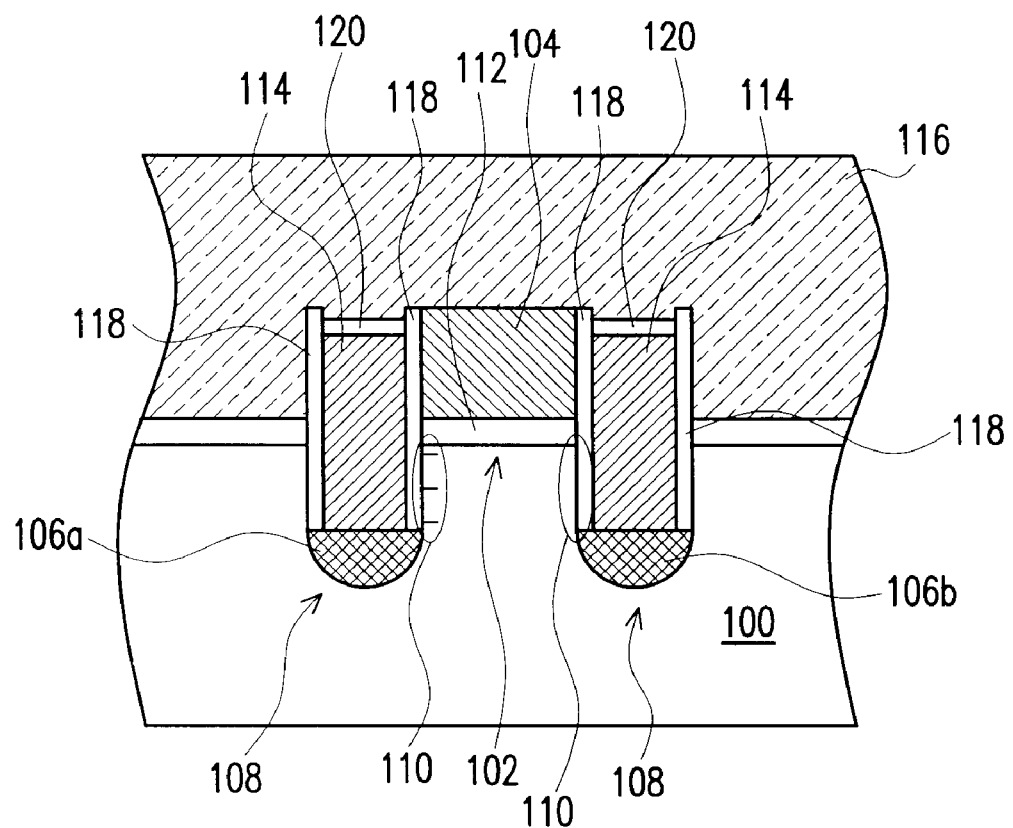

FIG. 1 schematically illustrates a vertical read-only memory provided in the first embodiment of this invention.

Refer to FIG. 1, the vertical read-only memory comprises a gate conductive layer 104 on a substrate 100 having a protruding region 102 and two depressed regions 108, two conductive layers 114 serving as two bit-lines, a word-line 116, a source/drain 106a/106b, and two coding regions 110. The gate conductive layer 104 is located on the protruding region 102, while the conductive layer 114 is located on the depressed regions 108 and electrically connects with the source/drain 106a/106b. The source/drain 106a/106b is located in the depressed regions 108 and the two coding regions 110 are each located in the substrate 100 of one side-wall of the protruding region 102. The word-line 116 is disposed on the substrate 100 and electrically connects with the gate conductive layer 104. Moreover, a gate oxide layer 112 is disposed between the gate conductive layer 104 and the substrate 100. An insulating layer 118 is disposed between the conductive layer 114 and the side-walls of the depressed regions 108 and a silicon oxide layer 120 is disposed between the conductive layer 114 and the word-line 116.

Moreover, the coding regions 110 are formed by a coding implantation using an ion with a second conductivity type, which is different from a first conductivity type of the dopants that are originally in the coding regions 110. The concentration of the dopants of the second conductivity type is smaller than the concentration of the dopants of the first conductivity type, so that the coding region 110 implanted during the coding implantation is of a low concentrated first conductivity type and thereby has a lower threshold voltage.

To read the data stored in the memory cell, the gate 104 is turned on and a high voltage is applied on the drain 106b, while a low voltage is applied on the source 106a. An inversion region thereby is formed in the substrate under the gate 104 and beside the drain 106b. If the coding region 110 at the side of the source 106a is implanted (marked by the symbol "−"), an inversion region will be induced therein since the threshold voltage is lowered there. Consequently, a continuous channel is formed in the substrate 100 along the gate 104, the drain 106b and the source 106a and a current thus can be detected. On the contrary, if the coding region 110 at the side of the source 106a is not implanted, the threshold voltage is higher so that the low voltage applied on the source 106a is not enough to induce an inversion layer therein, and thus little current can be detected.

Second Embodiment

Figure 2A:
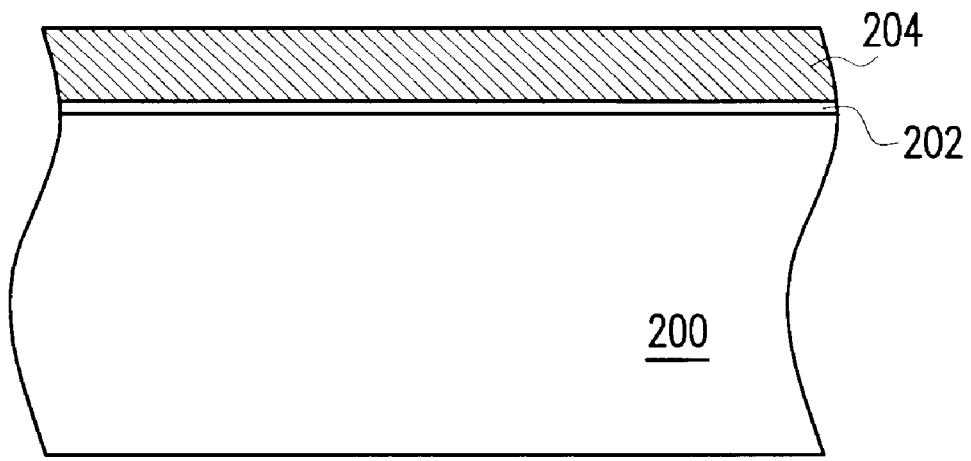
FIG. 2A~2Q schematically illustrate a process flow of fabricating a vertical read-only memory in a cross-sectional view in the second embodiment of this invention.
Figure 2B:
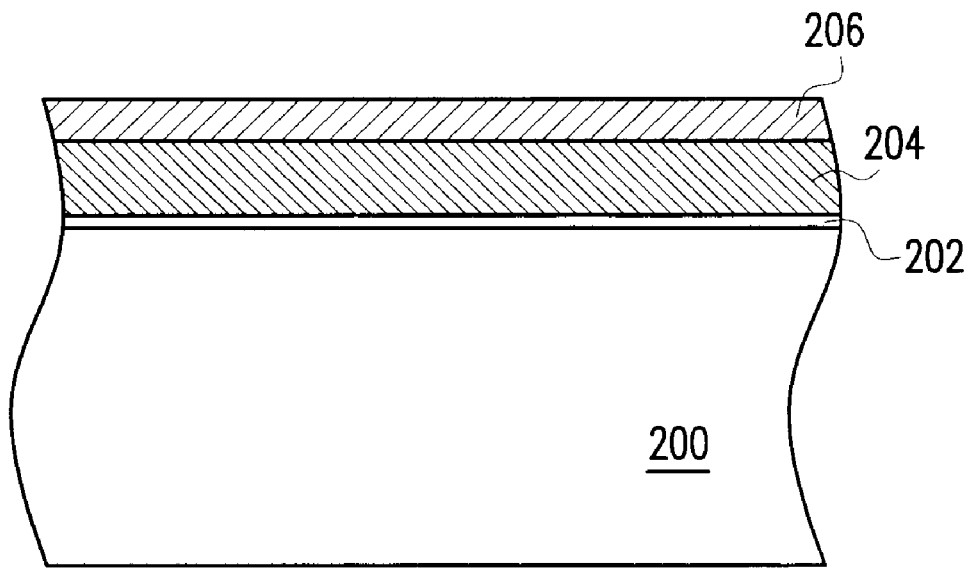
Figure 2C:
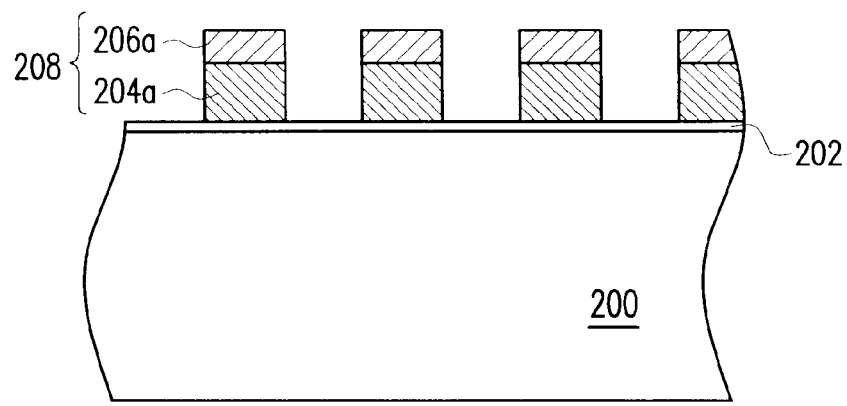
Figure 2D:
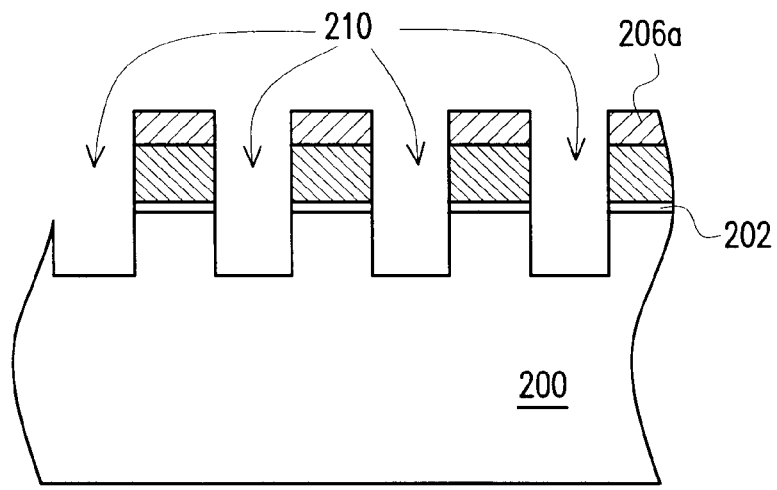
Figure 2E:
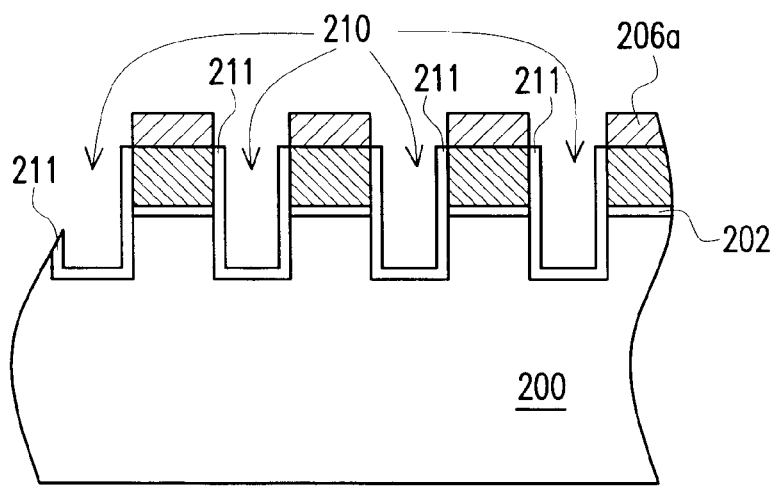
Figure 2F:
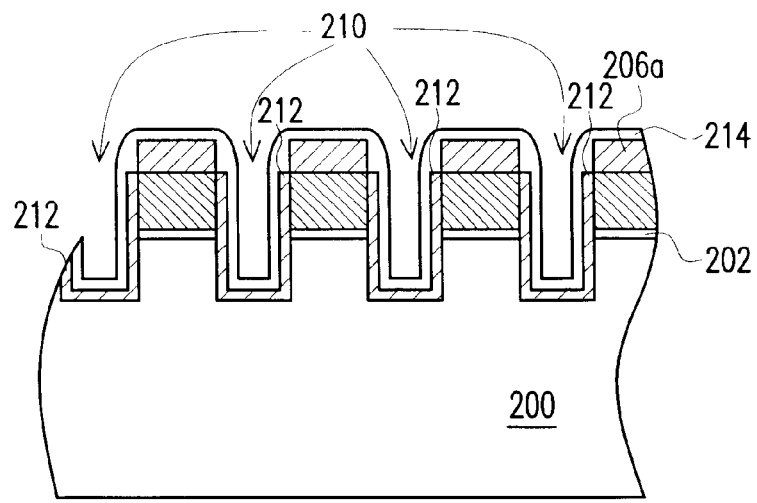
Figure 2G:
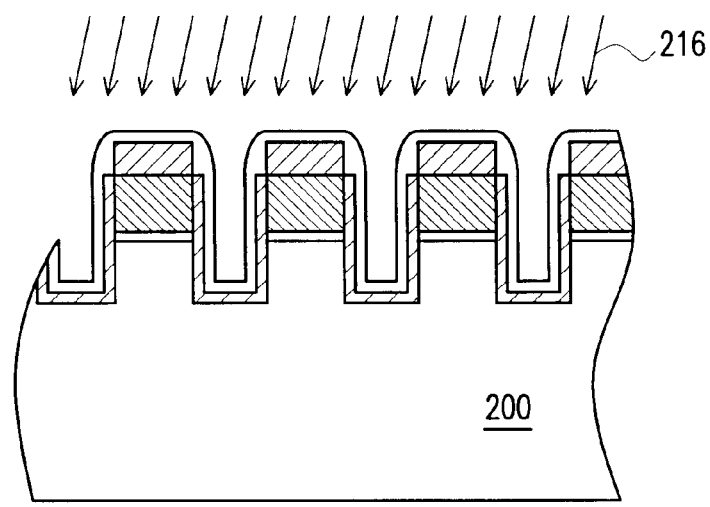
Figure 2H:
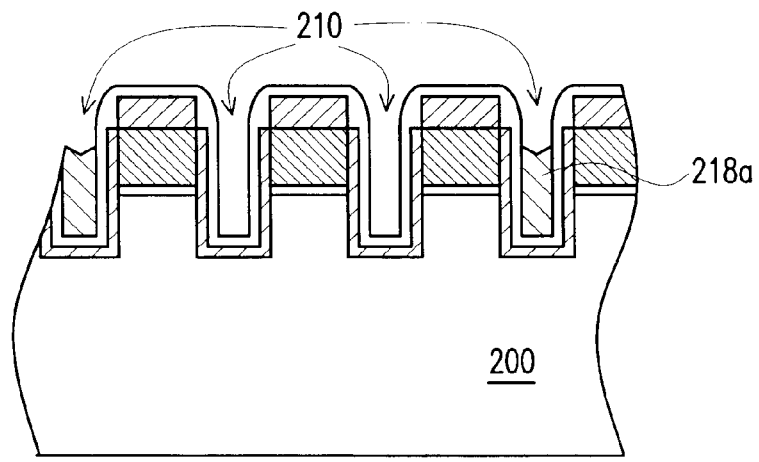
Figure 2I:
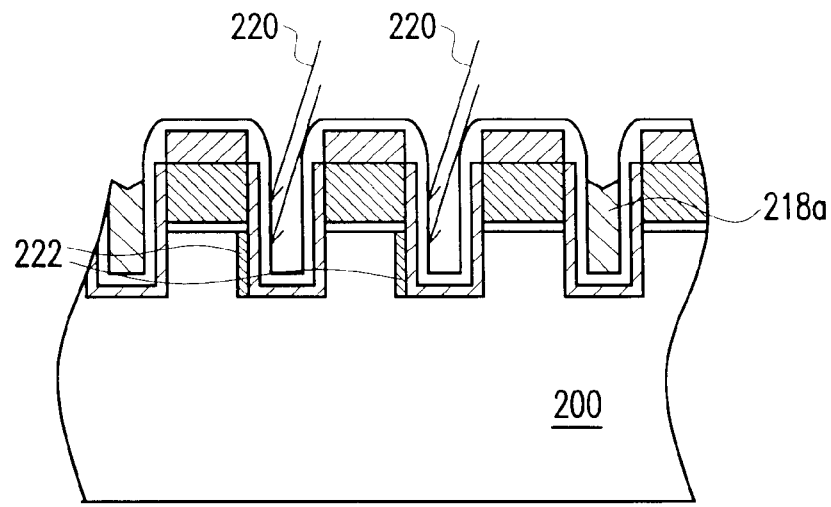
Figure 2J:
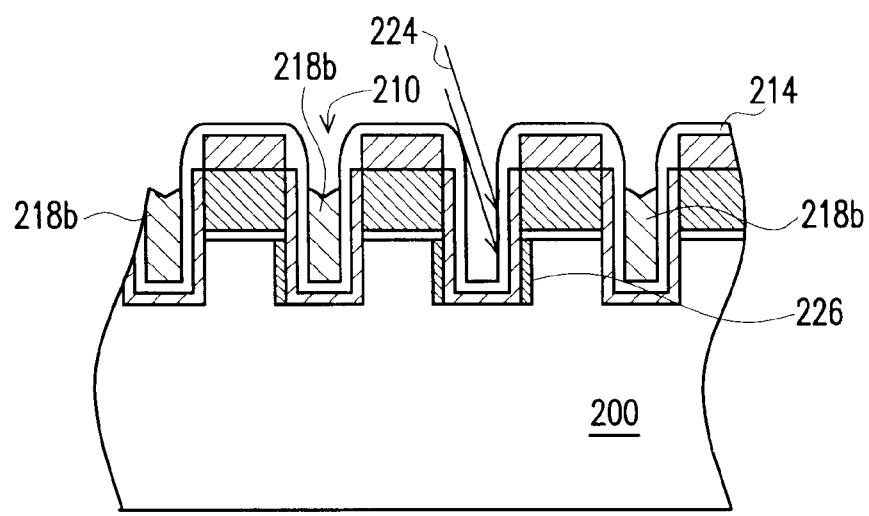
Figure 2K:
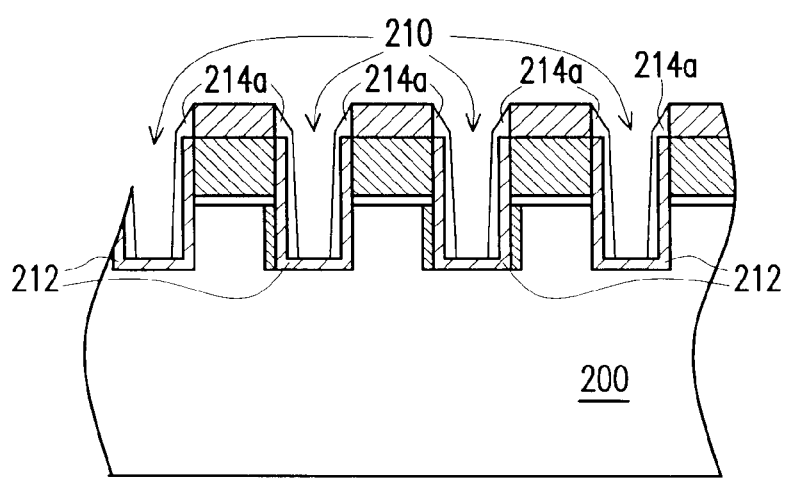
Figure 2L:
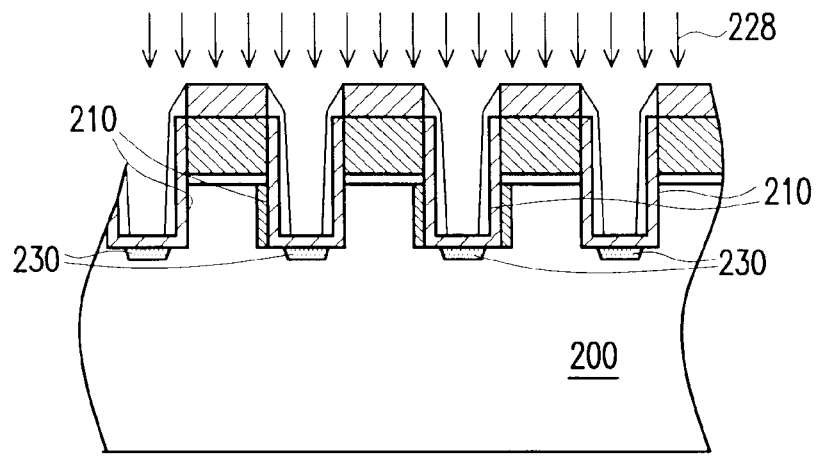
Figure 2M:
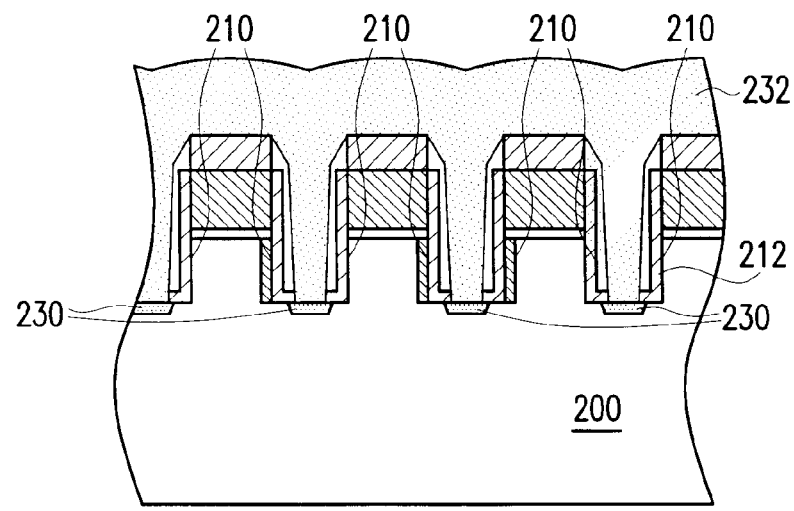
Figure 2N:
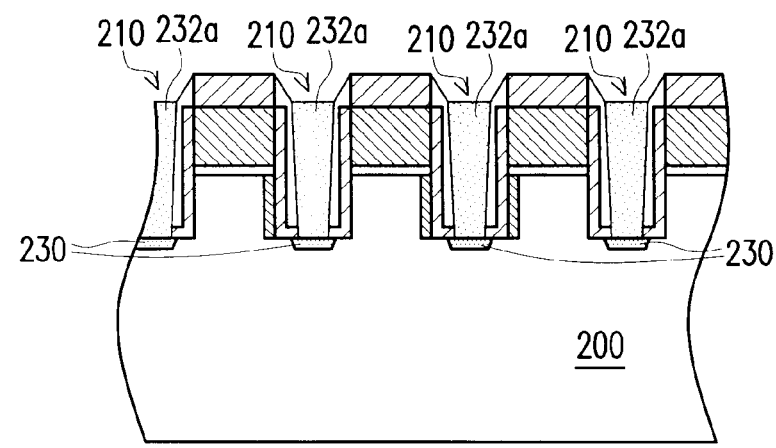
Figure 2O:
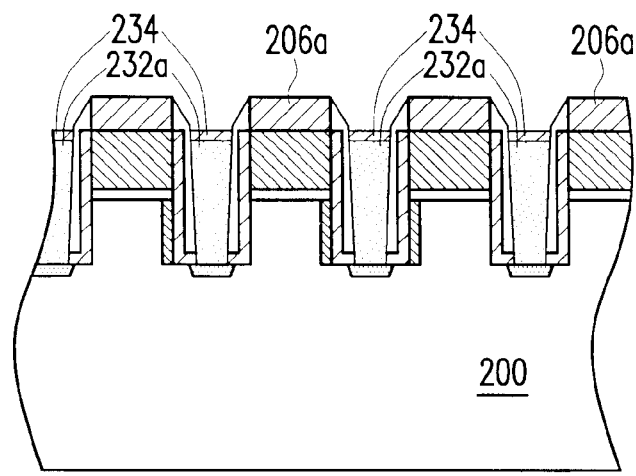
Figure 2P:
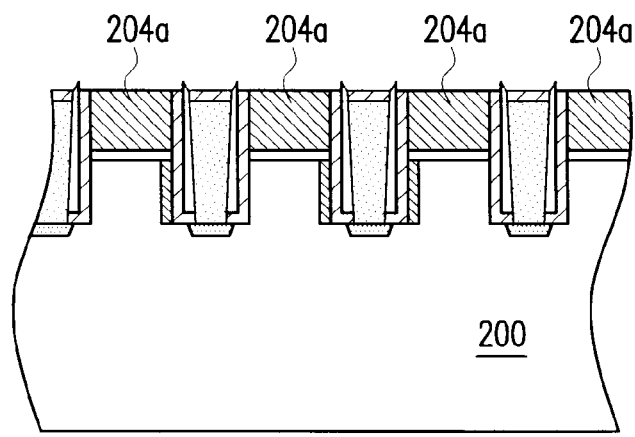
Figure 2Q:
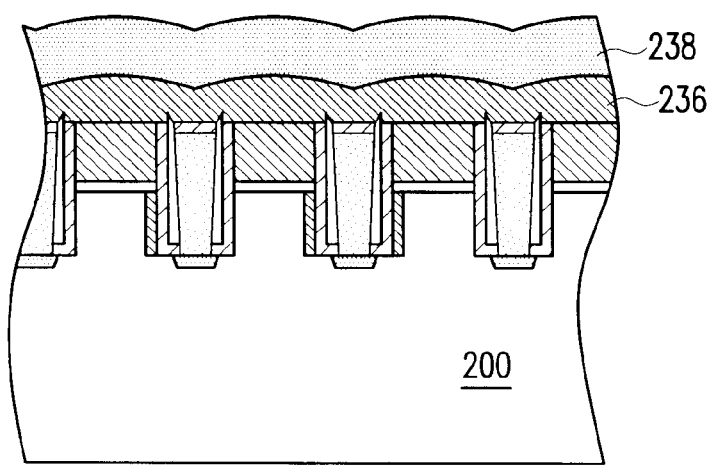

FIG. 2A~2Q schematically illustrate a process flow of fabricating a vertical read-only memory in a cross-sectional view in the second embodiment of this invention.

Refer to FIG. 2A, a gate oxide layer 202 having a thickness of about 30 Å is formed on a substrate 200 and then a gate conductive layer 204 having a thickness of about 1500 Å is formed over the substrate 200.

Refer to FIG. 2B, a cap layer 206 having a thickness of about 600 Å is then formed over the substrate 200 to cover the gate conductive layer 204. A pre-clean process and a post-clean process, however, can be optionally conducted before and after the step of forming the cap layer 206, respectively.

Refer to FIG. 2C, the cap layer 206 and the gate conductive layer 204 are then patterned to form gate stacks 208 each consisting of a gate conductive layer 204a and a cap layer 206a on the substrate 200.

Refer to FIG. 2D, by using the cap layer 206a as an etching mask, the exposed gate oxide layer 202 is removed and then the exposed substrate 200 is etched with a rate of 1500±150 Å/min to form trenches 210.

Refer to FIG. 2E, a silicon oxide layer 211 with a thickness of about 50 Å is then formed on the side-walls of the trenches 210, while a pre-clean process is further conducted before the step of forming silicon oxide layer 211. This process is intended to repair the damages caused by the preceding etching step of the trenches 210, while such a process is also optional.

Refer to FIG. 2F, the silicon oxide layer 211 is removed and then a high threshold voltage ($V_T$) gate dielectric layer 212 with a thickness of about 15~100 Å is formed on the surface of the trench 210 by using a method such as thermal oxidation. Thereafter, a thin polysilicon layer 214 with a thickness of about 100 Å is deposited on the substrate 200 for protecting the high $V_T$ gate dielectric layer 212 from the damages during the subsequent ion implantation process.

Refer to FIG. 2G, a high $V_T$ ion implantation 216 is then performed toward the substrate 200 to raise the threshold voltage, wherein the ion used is, for example, boron difluoride ion ($BF_2^+$) and the implantation angle is about 15°.

Refer to FIG. 2H, a mask layer 218a is formed in some of the trenches 210 to serve as a mask during a subsequent $1^{st}$ ROM coding process. The mask layer 218a comprises, for example, photoresist and has a thickness of about 1000 Å.

Refer to FIG. 2I, a $1^{st}$ ROM coding implantation 220 with a conductivity type different from that of the high $V_T$ ion implantation 216 is conducted to form first coding regions 222 in the substrate 200. The ion used in this step is, for example, arsenic ion ($As^+$) and the implantation angle is about 20°.

Refer to FIG. 2J, the mask layer 218a is removed and then a mask layer 218b is formed in some of the trenches 210. A $2^{nd}$ ROM coding implantation 224 is then conducted to form second coding regions 226 in the substrate 200, wherein the ion used is, for example, arsenic ion ($As^+$) and the implantation angle is about 20°.

Refer to FIG. 2K, the mask layer 218b is removed and then the thin polysilicon layer 214 is etched back to expose the high $V_T$ gate dielectric layer 212 at the bottom of the trenches 210 and leave a polysilicon spacer 214a on the side-wall of the trench 210.

Refer to FIG. 2L, a buried diffusion ion implantation 228 is performed to form a source/drain in the substrate 200 at the bottom of each trench 210, wherein the ion used is, for example, arsenic ion ($As^+$), the energy is about 10 KeV, and the dosage is about $1 \times 10^{14}/cm^2$. In addition, a pocket ion implantation may be conducted before the buried diffusion ion implantation 228 with $BF_2^+$ ions and with an implantation angle of about 20°.

Refer to FIG. 2M, the high $V_T$ gate dielectric layer 212 on the source/drain 230 at the bottom of each trench 210 is then removed by, for example, wet etching. Subsequently, a pre-clean process is performed and then a conductive layer 232 is deposited on the substrate 200, wherein the conductive layer 232 comprises, for example, polysilicon, and has a thickness of about 3000 Å.

Refer to FIG. 2N, the conductive layer 232 is then etched back to leave a conductive layer 232a serving as a bit-line on the source/drain 230.

Refer to FIG. 2O, an insulating layer 234 is then formed on the conductive layer 232a, the insulating layer 234 having a thickness of about 200 Å and comprising silicon oxide, for example.

Refer to FIG. 2P, the cap layer 206a is then removed by, for example, hot phosphoric acid ($H_3PO_4$) to expose the top of the gate conductive layer 204a.

Refer to FIG. 2Q, a polysilicon layer 236 is formed on the substrate 200 after a pre-clean process intended for cleaning the surface of the substrate 200. A metal silicide layer 238, such as a tungsten silicide layer, is then formed on the polysilicon layer 236. Finally, the metal silicide layer 238 and the polysilicon layer 236 are patterned into a plurality of word-lines (not shown in this cross-sectional view), and then the gate conductive layer 204a is patterned into a plurality of gates.

Since the two bits are stored in the two coding regions perpendicular to the surface of the wafer in the vertical read-only memory of this invention, the miniature of the memory device will not be restricted by the minimum linewidth of the lithography process. Therefore, the memory device can be easily scaled down.

Besides, the threshold voltage of the channel in the substrate 200 of the side-wall of the trench 210 is determined by the thickness of the high $V_T$ gate dielectric layer 212, which can be controlled by the conditions for forming the high $V_T$ gate dielectric layer 212. Therefore, the threshold voltage distribution of the memory device is more uniform so that the leakage current is decreased.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A vertical read-only memory, comprising:
    a substrate having on it at least a protruding region and at least a depressed region adjacent to the protruding region, the protruding region and the depressed region arranged alternatively;
    a gate conductive layer on the protruding region of the substrate;
    a source/drain in the depressed region;
    two coding regions on two opposite side-walls of the protruding region, respectively;
    a gate dielectric layer between the gate conductive layer and the substrate so as to form a gate structure on top of the protruding region;
    a bit-line being located on the depressed region of the substrate and electrically connecting with the source/drain;
    a word-line being on the substrate and electrically connecting with the gate conductive layer; and an insulating layer between the gate conductive layer and the bit-line and on side-walls of the depressed region.

2. The vertical read-only memory of claim 1, further comprising a silicon oxide layer between the word-line and the bit-line.

3. The vertical read-only memory of claim 1, wherein the gate conductive layer comprises polysilicon.

4. The vertical read-only memory of claim 1, wherein the word-line comprises polysilicon.

5. The vertical read-only memory of claim 1, further comprising a metal silicide layer on the word-line.

6. The vertical read-only memory of claim 5, wherein the metal silicide layer comprises tungsten silicide.

7. The vertical read-only memory of claim 1, wherein the gate dielectric layer does not cover the depressed region.

* * * * *